(12) United States Patent
Kim et al.

(10) Patent No.: US 10,529,806 B2
(45) Date of Patent: Jan. 7, 2020

(54) ARRAY SUBSTRATE FOR THIN-FILM TRANSISTOR AND DISPLAY DEVICE OF THE SAME

(71) Applicant: LG Display Co., Ltd., Seoul (KR)

(72) Inventors: Changeun Kim, Gunpo-si (KR);
Jeongeun Baek, Seoul (KR);
Yonggyoon Jang, Paju-si (KR);
Sungjin Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 46 days.

(21) Appl. No.: 15/715,059

(22) Filed: Sep. 25, 2017

(65) Prior Publication Data

US 2018/0097062 A1 Apr. 5, 2018

(30) Foreign Application Priority Data

Sep. 30, 2016 (KR) .................. 10-2016-0127114

(51) Int. Cl.
*H01L 29/10* (2006.01)
*H01L 29/786* (2006.01)
(Continued)

(52) U.S. Cl.
CPC ........ *H01L 29/105* (2013.01); *H01L 29/1054* (2013.01); *H01L 29/227* (2013.01);
(Continued)

(58) Field of Classification Search
CPC ............... H01L 27/3274; H01L 29/105; G02F 1/136286; G02F 1/1368; G02F 1/13556;
(Continued)

(56) References Cited

U.S. PATENT DOCUMENTS 8,519,406 B2 8/2013 Yoon et al.
10,108,291 B2 10/2018 Hu
(Continued)

FOREIGN PATENT DOCUMENTS

CN 104538453 A 4/2015
KR 10-2015-0040076 A 4/2015
(Continued)

OTHER PUBLICATIONS

European Extended Search Report, European Application No. 17194168.5, dated Feb. 7, 2018, 8 pages.
(Continued)

*Primary Examiner* — Paisley L Wilson
*Assistant Examiner* — Mariam Qureshi
(74) *Attorney, Agent, or Firm* — Fenwick & West LLP

(57) ABSTRACT

A carbon allotrope and a display device including the same are disclosed. The thin-film transistor array substrate, comprising a substrate, a gate electrode on the substrate, an active layer comprising a first active layer, which opposes the gate electrode and is adjacent to the gate electrode thereby comprising a semiconductor material and a plurality of carbon allotropes, and a second active layer, which is in contact with the first active layer and comprises a semiconductor material, a gate insulating film between the gate electrode and the active layer, and a source electrode and a drain electrode respectively in contact with the active layer.

23 Claims, 7 Drawing Sheets

(51) Int. Cl.
*H01L 29/227* (2006.01)
*H01L 29/24* (2006.01)
*G02F 1/1368* (2006.01)
*H01L 27/12* (2006.01)
*H01L 27/28* (2006.01)
*H01L 27/32* (2006.01)
*H01L 51/05* (2006.01)

(52) U.S. Cl.
CPC .......... *H01L 29/24* (2013.01); *H01L 29/7869* (2013.01); *H01L 29/78669* (2013.01); *H01L 29/78681* (2013.01); *H01L 29/78684* (2013.01); *H01L 29/78696* (2013.01); *G02F 1/1368* (2013.01); *H01L 27/1225* (2013.01); *H01L 27/283* (2013.01); *H01L 27/3274* (2013.01); *H01L 51/0562* (2013.01)

(58) Field of Classification Search
CPC ..... G02F 2001/136281; G02F 2202/10; G02F 2202/102; G02F 2202/104
See application file for complete search history.

(56) References Cited

U.S. PATENT DOCUMENTS

| | | | |
|---|---|---|---|
| 2011/0165711 A1* | 7/2011 | Kim | B82Y 10/00 438/34 |
| 2012/0153286 A1 | 6/2012 | Yoon et al. | |
| 2012/0161098 A1* | 6/2012 | Hiura | C23C 16/0218 257/9 |
| 2016/0215217 A1* | 7/2016 | Akiyama | C09K 19/2021 |
| 2016/0322444 A1* | 11/2016 | Kang | H01L 27/3272 |
| 2016/0334918 A1* | 11/2016 | Hu | H01L 29/78693 |

FOREIGN PATENT DOCUMENTS

| | | |
|---|---|---|
| TW | 201228068 A | 7/2012 |
| TW | 201507033 A | 2/2015 |
| WO | WO 2016107185 A1 | 7/2016 |

OTHER PUBLICATIONS

Taiwanese Office Action, Taiwanese Patent Application No. 106133010, dated Nov. 22, 2018, 10 pages.

\* cited by examiner

ARRAY SUBSTRATE FOR THIN-FILM TRANSISTOR AND DISPLAY DEVICE OF THE SAME

CROSS-REFERENCE TO RELATED APPLICATIONS

This application claims the priority benefit of Republic of Korea Patent Application No. 10-2016-0127114 filed on Sep. 30, 2016, which is incorporated herein by reference in its entirety.

BACKGROUND

Field of Technology

The present disclosure relates to a thin-film transistor array substrate and a display device including the same.

Discussion of the Related Art

Recently, the importance of flat panel display (FPD) devices is increasing with the development of multimedia. Accordingly, various displays such as liquid crystal display (LCD) devices, plasma display panels (PDPs), field emission display (FED) devices, organic light emitting display (OLED) devices are put into practical use.

Methods for driving display devices include a passive matrix method and an active matrix method using a thin-film transistor. In the passive matrix method, an anode and a cathode are formed to be orthogonal to each other and a line is selected to be driven while, in the active matrix method, a thin-film transistor is connected to each pixel electrode to perform the driving according to on/off switching.

Thin-film transistors are very important not only for the basic characteristics of thin-film transistors such as electron mobility and leakage current, but also for durability and electrical reliability that can maintain a long lifetime. In particular, an active layer of the thin-film transistor may be formed mainly of amorphous silicon, polycrystalline silicon, or oxide semiconductor. Amorphous silicon is advantageous in that the film-forming process is simple and the production cost is low, but it is disadvantageous in that the electron mobility is as low as 0.5 $cm^2V/s$. Oxide semiconductor has an on/off ratio of about 108 and a low leakage current, but it is disadvantageous in that it has an electron mobility of 10 $cm^2V/s$, which is lower than that of polycrystalline silicon. Polycrystalline silicon has high electron mobility of about 100 $cm^2V/s$, but it is disadvantageous in that it has a low on/off ratio compared to oxide semiconductor and it is expensive to apply it to a large area. Accordingly, studies for improving characteristics of the thin-film transistors such as electron mobility, leakage current, on/off ratio, etc., are being conducted.

SUMMARY

The present disclosure provides a thin-film transistor array substrate capable of improving the characteristics of an element by forming an active layer including a carbon allotrope and a display device including the same.

In one aspect, there is provided a thin-film transistor array substrate, comprising a substrate, a gate electrode on the substrate, an active layer comprising a first active layer, which opposes the gate electrode and is adjacent to the gate electrode thereby comprising a semiconductor material and a plurality of carbon allotropes, and a second active layer, which is in contact with the first active layer and comprises a semiconductor material, a gate insulating film between the gate electrode and the active layer, and a source electrode and a drain electrode respectively in contact with the active layer.

The second active layer further comprises a plurality of carbon allotropes, and the content ratio being accounted by the carbon allotropes in the first active layer is higher than the content ratio being accounted by the carbon allotropes in the second active layer.

The carbon allotropes are dispersed within the semiconductor material.

The content ratio of the carbon allotropes in the first active layer decreases as the carbon allotropes go farther from the gate electrode.

The content ratio of the carbon allotropes in the second active layer decreases as the carbon allotropes go farther from the gate electrode.

The carbon allotropes have a one-dimensional structure or two-dimensional structure.

The carbon allotrope is one selected from a group consisting of reduced graphene oxide (rGO), non-oxidized graphene, graphene nanoribbon, carbon nanotube (CNT), or a mixture thereof.

The semiconductor material is one selected from a group consisting of a ceramic semiconductor, an organic semiconductor, a transition metal chalcogenide, and an oxide semiconductor, or a mixture thereof.

A content of the carbon allotropes in the first active layer is 0.05 wt % to 1 wt % based on 100 wt % of a content of the semiconductor material.

A content of the carbon allotropes in the second active layer is 0.001 wt % to 0.01 wt % based on 100 wt % of a content of the semiconductor material.

The thickness of the first active layer and the second active layer is in a range of 1 nm to 10 nm, respectively.

In one aspect, there is provided a display device, comprising a substrate, a gate electrode on the substrate, an active layer comprising a first active layer, which opposes the gate electrode and is adjacent to the gate electrode thereby comprising a semiconductor material and a plurality of carbon allotropes, and a second active layer, which is in contact with the first active layer and comprises a semiconductor material, a gate insulating film between the gate electrode and the active layer, a source electrode and a drain electrode respectively in contact with the active layer, an organic insulating film on the source electrode and the drain electrode, and a pixel electrode on the organic insulating film.

The second active layer further comprises a plurality of carbon allotropes, and the content ratio being accounted by the carbon allotropes in the first active layer is higher than the content ratio being accounted by the carbon allotropes in the second active layer.

The carbon allotropes are dispersed within the semiconductor material.

The content ratio of the carbon allotropes in the first active layer decreases as the carbon allotropes go farther from the gate electrode.

The content ratio of the carbon allotropes in the second active layer decreases as the carbon allotropes go farther from the gate electrode.

The carbon allotropes have a one-dimensional structure or two-dimensional structure.

The carbon allotrope is one selected from a group consisting of reduced graphene oxide (rGO), non-oxidized graphene, graphene nanoribbon, carbon nanotube (CNT), or a mixture thereof.

The semiconductor material is one selected from a group consisting of a ceramic semiconductor, an organic semiconductor, a transition metal chalcogenide, and an oxide semiconductor, or a mixture thereof.

A content of the carbon allotropes in the first active layer is 0.05 wt % to 1 wt % based on 100 wt % of a content of the semiconductor material.

A content of the carbon allotropes in the second active layer is 0.001 wt % to 0.01 wt % based on 100 wt % of a content of the semiconductor material.

The thickness of the first active layer and the second active layer is in a range of 1 nm to 10 nm, respectively.

The display device further comprises an organic light emitting diode electrically connected to the pixel electrode, an encapsulation layer on the organic light emitting diode, and a cover window on the encapsulation layer.

The display device further comprises a common electrode, which is disposed to be spaced apart from the pixel electrode on the same plane or a lower part thereof, and a liquid crystal layer disposed on the common electrode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
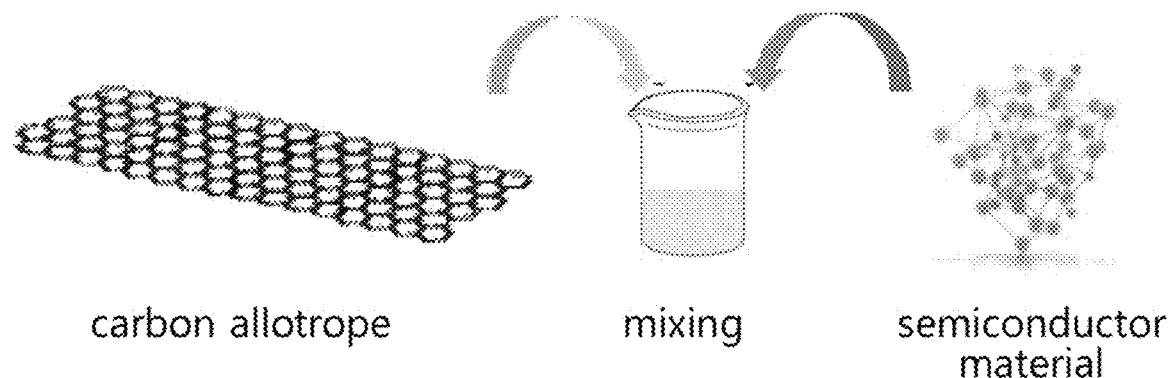
FIGS. 1 and 2 show schematic diagrams illustrating processes for preparing a carbon allotrope-semiconductor composition of the present disclosure.

Hereinafter, exemplary embodiments of the present disclosure will be described in detail with reference to illustrative drawings. In adding reference numerals to the constituent elements of the drawings, it should be noted that throughout the specification the same constituting elements are denoted by the same reference symbols as possible even if they are displayed on different drawings, like reference numerals denote substantially like components. Additionally, in explaining the exemplary embodiments of the present disclosure, if it is determined that the detailed description with regard to known functions or configurations related to the invention may obscure the gist of the invention, detailed description thereof will be omitted.

In explaining the constituent elements of the invention, terms such as a first, a second, A, B, (a), and (b) may be used. These terms are intended to distinguish the constituent elements from other constituent elements, and the nature, order, sequence, etc., of the constituent elements are not limited by these terms. When a constituent element is described as being "linked", "coupled", or "connected" with another constituent element, it may be understood that the constituent element is directly linked, coupled, or connected to the different constituent element, but it may also be understood that the different constituent element is linked, coupled, or connected between each of the constituent elements. In the same context, when a constituent element is described as being formed "on" or "below" of a different constituent element, it should be understood to include a case where the constituent element is directly formed on the different constituent element and a case where the constituent element is indirectly formed by interposing an another different constituent element to the different constituent element.

The display device according to the present disclosure described below may be an organic light emitting display device, a liquid crystal display device, an electrophoretic display device, etc. In the present disclosure, the liquid crystal display device is described as an exemplary embodiment. The liquid crystal display consists of a thin-film transistor array substrate, in which a pixel electrode and a common electrode are formed on a thin-film transistor, a color filter substrate, and a liquid crystal layer interposed between the two substrates. In such a liquid crystal display device, the liquid crystal is driven by an electric field that is vertically or horizontally applied to the common electrode and the pixel electrode. The display device according to the present disclosure may also be used in an organic light emitting display device. For example, the organic light emitting display device includes a first electrode and a second electrode connected to a thin-film transistor, and a light emitting layer, made of an organic material, disposed therebetween. Therefore, the holes supplied from the first electrode and the electrons supplied from the second electrode are combined in the light emitting layer to form excitons, which are hole-electron pairs, and the excitons emit light by energy generated as they return to the ground state. The active layer containing the carbon allotrope of the present disclosure described below may be used in the thin-film transistor of the above-described display device.

Hereinafter, exemplary embodiments of the present disclosure will be described with reference to the accompanying drawings.

The present disclosure discloses a thin-film transistor including a carbon allotrope and a semiconductor material, and specifically, a thin-film transistor in which an active layer including a carbon allotrope and a semiconductor material is formed. The thin-film transistor is used as a switching element or a driving element of a display device.

Carbon Allotrope

The carbon allotrope disclosed in the present disclosure represents a polycyclic aromatic molecule having carbon atoms covalently bonded to each other. The covalently-bonded carbon atoms may form a 6-membered ring as a repeating unit, and additionally, may also include at least one selected from a 5-membered ring and a 7-membered ring. A carbon allotrope may be a single layer or it may include multiple carbon allotrope layers stacked on a different layer of a carbon allotrope. A carbon allotrope may have a one-dimensional or two-dimensional structure. A carbon allotrope has a maximum thickness of about 100 nm, specifically from about 10 nm to about 90 nm, and more specifically from about 20 nm to about 80 nm.

A carbon allotrope may be manufactured largely by four different methods such as physical exfoliation, chemical vapor deposition, chemical exfoliation, and epitaxial growth. Physical exfoliation is a method of attaching a scotch tape to a graphite sample and then removing it so as to obtain a carbon allotrope sheet detached from graphite on the surface of the scotch tape. Chemical vapor deposition is a method for growing crystalline allotropes of carbon by absorbing/decomposing carbon precursors in gas or vapor form with high kinetic energy on the surface of a substrate, where the crystalline allotropes of carbon are intended to be grown, so as to separate carbon atoms and establishing the formation of atomic bonds between the corresponding carbon atoms. Chemical exfoliation utilizes the oxidation-reduction characteristics of graphite and the graphite is added into a mixture of sulfuric acid and nitric acid and carboxyl compounds are attached to the edges of carbon allotrope plates. The resultant is converted to an acid chloride by chlorinated thinol and then again formed into a carbon allotrope amide using octadecylamine. When the carbon allotrope amide is recovered using a solution such as tetrahydrofuran, there occurs pulverization and individual carbon allotrope sheets are obtained. Epitaxial growth is a method for obtaining carbon allotropes by heating silicon carbide (SiC) at a high temperature of 1,500° C. and thereby silicon (Si) is removed and carbon allotropes are obtained by the remaining carbons.

The carbon allotrope to be used in the present disclosure may include reduced graphene oxide (rGO), non-oxidized graphene, graphene nanoribbon, carbon nanotube (CNT), etc. Reduced graphene oxide (GO) is a reduced form of graphene oxide, and reduced graphene oxide can be prepared by reducing graphene oxide, which is prepared by adding a strong acid to graphite to be oxidized and chemically formed into small particles. Non-oxidized graphene refers to a carbon allotrope which is prepared by a method among the above-described methods for preparing a carbon allotrope, other than the oxidation-reduction process. Graphene nanoribbons are prepared by cutting graphene in the form of a ribbon with a nanometer width and have a constant energy bandgap according to their width. The graphene nanoribbons may be synthesized from monomers containing a carbon allotrope or by cutting carbon nanotubes and spreading them into planes. In addition to the above-described types of carbon allotropes, known carbon allotrope structures such as graphene nanomesh, etc., may be used for the carbon allotrope of the present disclosure.

The carbon allotrope of the present disclosure is used in the form of a flake. Carbon allotrope flakes may be prepared by coating a dispersion, in which carbon allotropes are dispersed in a solvent, on a substrate, drying the solvent, and applying a physical force thereto. As a method of applying the physical force, a carbon allotrope flake may be obtained by a method such as a ball mill, a bead mill, an ultrasonic homogenizer, and stirring.

Semiconductor Material

The semiconductor material of the present disclosure may be a ceramic semiconductor, an organic semiconductor, a transition metal chalcogenide or oxide semiconductor that can be coated with a solution.

The ceramic semiconductor utilizes the electrical properties of ceramics. Since ceramics are bound to certain ions or atoms, they cannot move freely and are thus hardly electrified. However, when an electric field is applied from the outside, the electrons can move due to the rearrangement of the bound electrons in response to the change of state. A ceramic semiconductor is composed of oxides, carbides, and nitrides prepared by the binding between metal elements such as silicon (Si), germanium (Ge), selenium (Se), aluminum (Al), titanium (Ti), zirconium (Zr), etc., and oxygen (O), carbon (C), nitrogen (N), etc. A typical ceramic semiconductor may include barium titanate ($BaTiO_3$).

The organic semiconductor is an organic compound having semiconductor characteristics and may include polymeric organic semiconductors or low-molecular organic semiconductors. Examples of the polymeric organic semiconductors may include poly[(9,9-dioctylfluorenyl-2,7-diyl)-co-bithiophene] (F8T2), poly[(5,6-dihydro-5-octyl-4,6-dioxo-4H-thieno[3,4-C]pyrrole-1,3-diyl){4,8-bis[(2-butyloctyl)oxy]benzo[1,2-b:4,5-b']dithiophene-2,6-diyl}] (PBDTBOTPDO), poly[[5-(2-ethylhexyl)-5,6-dihydro-4,6-dioxo-4H-thieno[3,4-c]pyrrole-1,3-diyl][4,8-bis[(2-ethylhexyl)oxy]benzo[1,2-b:4,5-b']dithiophene-2,6-diyl]] (PBDT-TPD), poly[1-(6-{4,8-bis[(2-ethylhexyl)oxy]-6-methylbenzo[1,2-b:4,5-b']dithiophen-2-yl}-3-fluoro-4-methylthieno[3,4-b]thiophen-2-yl)-1-octanone] (PBDTTT-CF), poly[N-9'-heptadecanyl-2,7-carbazole-alt-5,5-(4',7'-di-2-thienyl-2',1',3'-benzothiadiazole) (PCDTBT), poly[[9-(1-octylnonyl)-9H-carbazole-2,7-diyl]-2,5-thiophenediyl-2,1,3-benzothiadiazole-4,7-diyl-2,5-thiophenediyl]), poly[2,6-(4,4-bis-(2-ethylhexyl)-4H-cyclopenta [2,1-b;3,4-b']dithiophene)-alt-4,7(2,1,3-benzothiadiazole)] (PCPDTBT), poly[2,7-(9,9-dioctylfluorene)-alt-4,7-bis(thiophen-2-yl) benzo-2,1,3-thiadiazole] (PFO-DBT), poly[bis(4-phenyl)(2,4,6-trimethylphenyl)amine] (PTAA), poly[(5,6-dihydro-5-octyl-4,6-dioxo-4H-thieno[3,4-c]pyrrole-1,3-diyl)[4,8-bis [(2-ethylhexyl)oxy]benzo[1,2-b:4,5-b']dithiophene-2,6-diyl]], poly[(9,9-di-n-octylfluorenyl-2,7-diyl)-alt-(benzo[2,1,3]thiadiazol-4,8-diyl)] (F8BT), poly(3-dodecylthiophene-2,5-diyl) (P3DDT), poly(3-hexylthiophene-2,5-diyl) (P3HT), poly[2-methoxy-5-(3',7'-dimethyloctyloxy)-1,4-phenylenevinylene] (MDMOPPV), poly[2-methoxy-5-(2-ethylhexyloxy)-1,4-phenylenevinylene] (MEH-PPV), poly(3-octylthiophene-2,5-diyl) (P3OT), and poly({4,8-bis[(2-ethylhexyl)oxy]benzo[1,2-b:4,5-b']dithiophene-2,6-diyl}{3-fluoro-2-[(2-ethylhexyl)carbonyl]thieno[3,4-b] thiophenediyl}) (PTB7), etc.

The low-molecular organic semiconductors may include, for example, 6,13-bis(triisopropylsilylethynyl)pentacene (TIPS-pentacene), 6,13-bis((triethylsilyl)ethynyl)pentacene (TESPentacene), 5,5'-bis(7-hexyl-9H-fluoren-2-yl)-2,2'-bithiophene (DH-FTTF), 2,8-difluoro-5,11-bis(triethylsilylethynyl)anthradithiophene (diF-TES-ADT), 5,5'-dihexyl-2,2'-bithiophene (DH2T), 3,3'''-dihexyl-2,2': 5',2": 5",2"'-quaterthiophene (DH4T), 5,5""''-dihexyl-2,2': 5',2": 5",2"': 5''', 2"":5"",2""'-sexithiophene (DH6T), 2(4,4'-[4,4-bis(2-ethylhexyl)-4H-silolo[3,2-b:4,5-b']dithiophene-2,6-diyl]bis [7-(5'-hexyl-[2,2'-bithiophen]-5-yl)-[1,2,5]thiadiazolo[3,4-c]pyridine] (DTS(PTTh2), 5,5'-bis{[4-(7-hexylthiophen-2-yl)thiophen-2-yl]-[1,2,5]thiadiazolo[3,4-c]pyridine}-3,3'-di-2-ethylhexylsilylene-2,2'-bithiophene), 2,5-di-(2-ethylhexyl)-3,6-bis-(5''-n-hexyl-[2,2',5',2'']terthiophen-5-yl)-pyrrolo[3,4-c]pyrrole-1,4-dione (SMDPPEH), 5,11-bis (triethylsilylethynyl)anthradithiophene (TES-ADT), etc.

As the above-described organic semiconductors, at least two kinds selected from polymeric organic semiconductors and low-molecular organic semiconductors may be used, or mutually different polymeric organic semiconductors may be used, or mutually different low-molecular organic semiconductors may be used.

The transition metal dichalcogenide is a material having semiconductor characteristics and may include transition metal sulfides, transition metal selenides, transition metal tellurides, etc. Examples of the transition metal dichalcogenide to be used may include, $SnSe_2$, CdSe, ZnSe, ZnTe, $MoS_2$, $MoSe_2$, $MoTe_2$, $WS_2$, $WSe_2$, $WTe_2$, etc.

The oxide semi-conductor is a material having semiconductor characteristics and may be an oxide containing a metal such as gallium (Ga), indium (In), zinc (Zn), tin (Sn), silicon (Si), zirconium (Zr), etc. Examples of the oxide semiconductor to be used may include IGZO, $In_2O_3$, ZnO, IZO, IGO, etc., but is not limited thereto and known materials may be used.

Carbon Allotrope-semiconductor Composition

Figure 2:
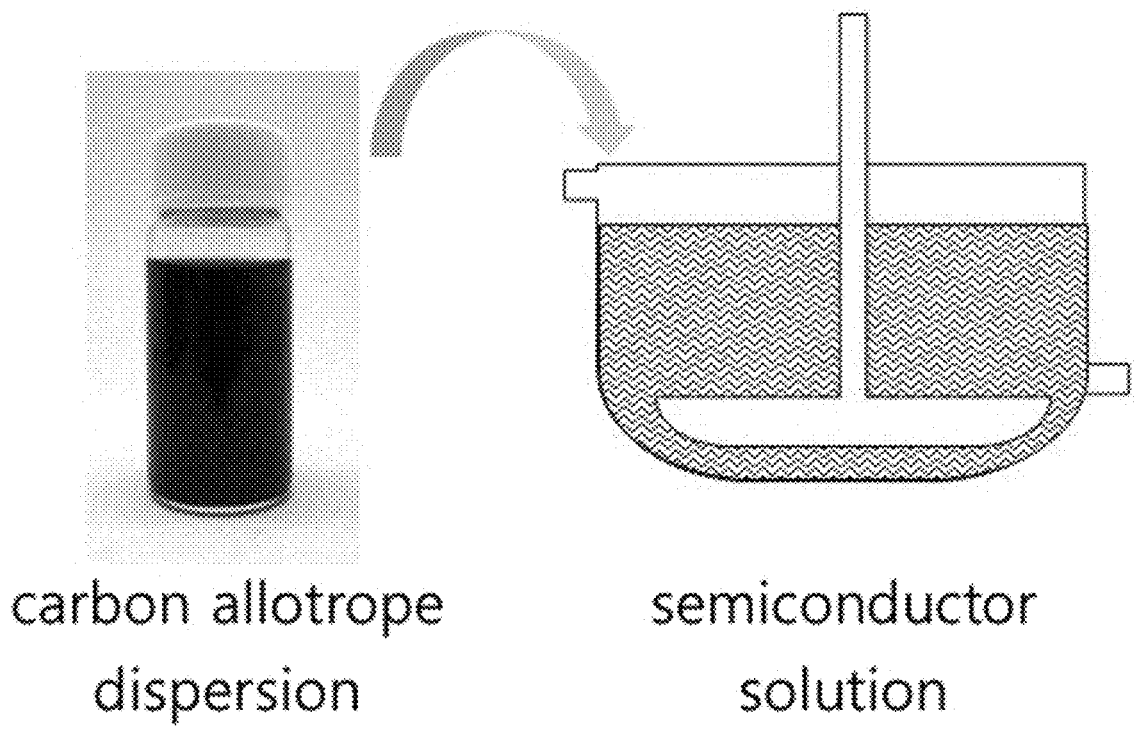

FIGS. 1 and 2 show schematic diagrams illustrating processes for preparing a carbon allotrope-semiconductor composition of the present disclosure.

The present disclosure can prepare a carbon allotrope-semiconductor composition by mixing a carbon allotrope and a semiconductor material. More specifically, referring to FIG. 1, a carbon allotrope flake and a semiconductor material are prepared. The carbon allotrope flake and semiconductor material may be prepared in the form of powder. The carbon allotrope flake and semiconductor material are mixed after adding them into a solvent to produce a carbon allotrope-semiconductor composition. Unlike the foregoing, referring to FIG. 2, the carbon allotrope-semiconductor composition of the present disclosure may be prepared by mixing a carbon allotrope dispersion in which a carbon allotrope is dispersed in a semiconductor solution containing a semiconductor material.

In particular, the solvent to be used may be at least one selected from the group consisting of water; alcohols selected from ethanol, methanol, isopropyl alcohol, butanol, 2-ethylhexyl alcohol, methoxypentanol, butoxyethanol, ethoxyethoxy ethanol, butoxyethoxy ethanol, methoxypropoxy propanol, texanol, terpineol, and a combination thereof; tetrahydrofuran (THF); glycerol, ethylene glycol, triethylene glycol, polyethylene glycol, propylene glycol, dipropylene glycol, dihexylene glycol, or alkyl ethers thereof; glycerin, N-methyl-2-pyrrolidinone (NMP), 2-pyrrolidone, acetylacetone, 1,3-dimethylimidazolinone, thiodiglycol, dimethyl sulfoxide (DMSO), N,N-dimethyl acetamide (DMAc), dimethylformamide (DMF), sulfolane, diethanolamine, triethanolamine, and a combination thereof.

For good dispersion of the carbon allotrope, other additives may be added or ultrasonic waves may be radiated thereto. When irradiating the carbon allotrope-semiconductor composition with ultrasonic waves, it is preferable to radiate ultrasonic waves in several times at intervals. For example, the carbon allotrope and the semiconductor material are mixed and irradiated with strong ultrasonic waves (about 250 W) for about 30 minutes with an ultrasonic crusher. By repeating such a process, the carbon allotrope-semiconductor composition with well dispersed carbon allotrope can be prepared.

The carbon allotrope to be used in the carbon allotrope-semiconductor composition of the present disclosure may be contained in an amount between 0.001 wt % and 1 wt % based on 100 wt % of the semiconductor material solids. In particular, when a content of the carbon allotrope is greater than or equal to 0.001 wt % based on 100 wt % of the semiconductor material solids, the charge mobility can be improved, whereas when a content of the carbon allotrope is less than or equal to 1 wt % based on 100 wt % of the semiconductor material solids, the effect of preventing the on-off ratio from being lowered can be exhibited.

Hereinafter, the thin-film transistor including an active layer using the above-described carbon allotrope-semiconductor composition and a display device thereof will be described.

Figure 3:
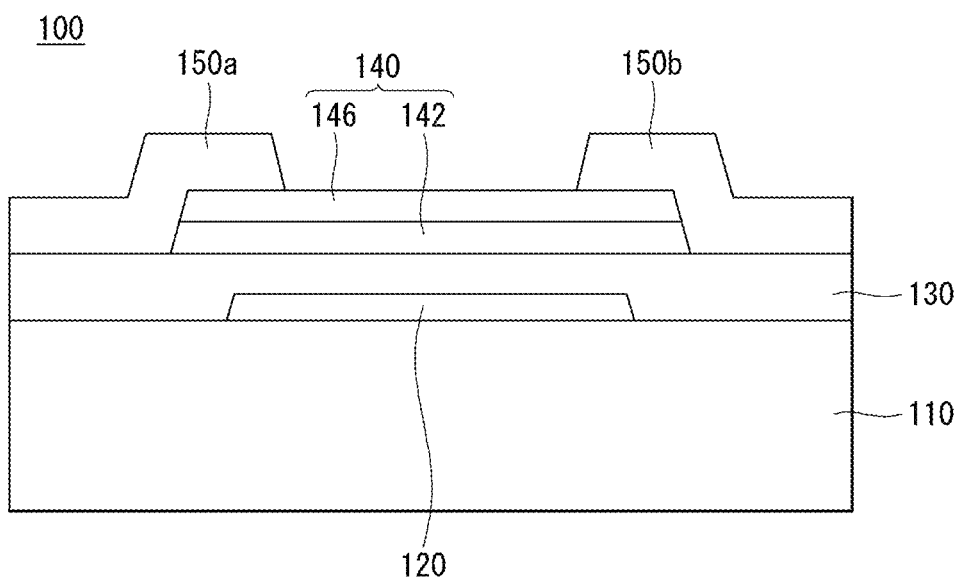
FIG. 3 shows a cross-sectional view of a thin-film transistor array substrate according to an exemplary embodiment of the present disclosure.
Figure 4:
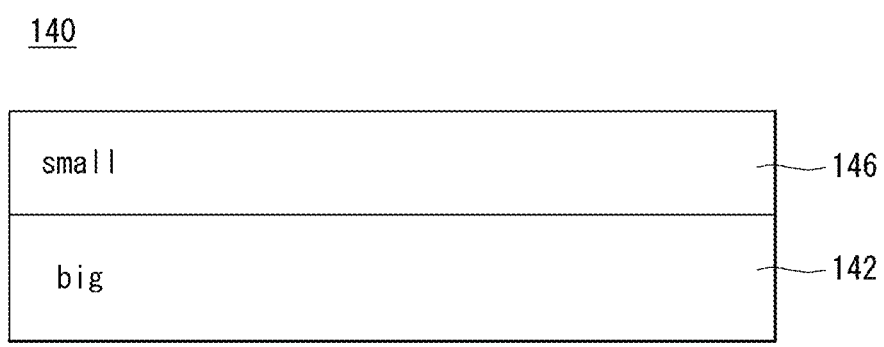
FIGS. 4 and 5 show cross-sectional views illustrating an active layer according to exemplary embodiments of the present disclosure.
Figure 5:
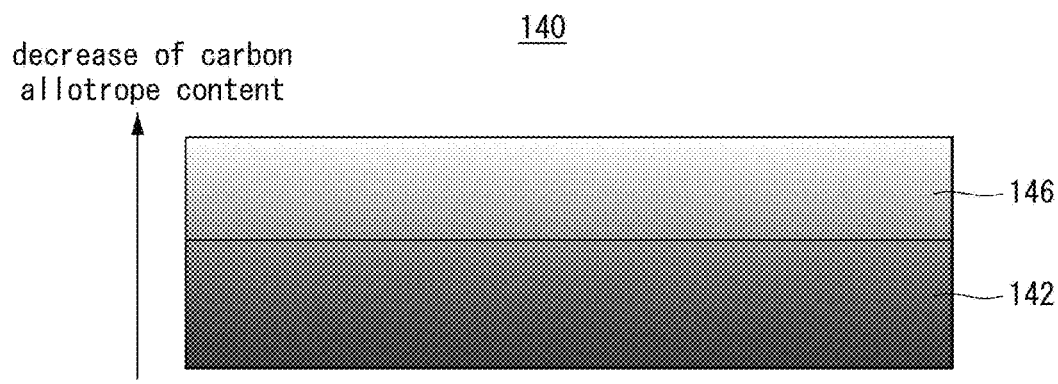
Figure 6:
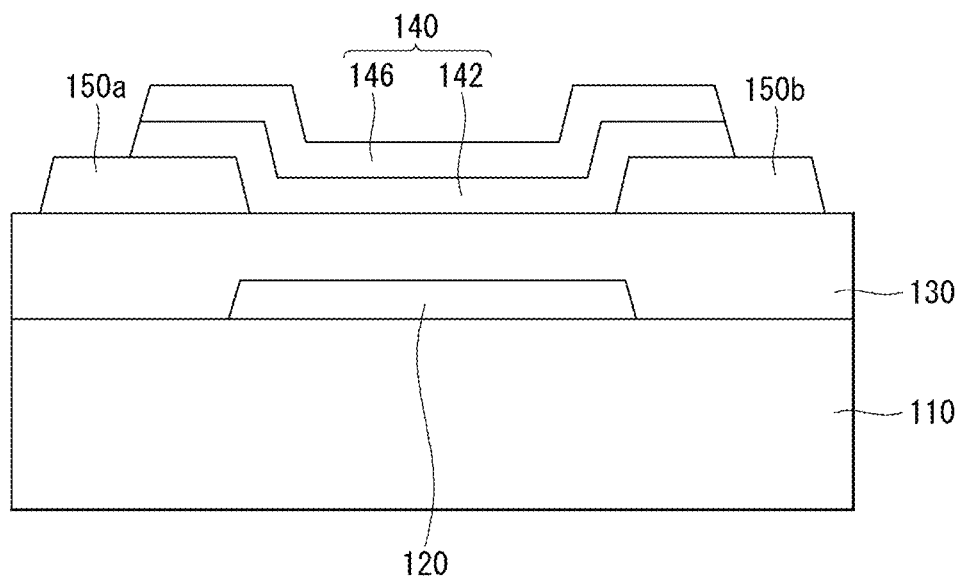
FIGS. 6 to 8 show cross-sectional views illustrating various structures of a thin-film transistor array substrate according to exemplary embodiments of the present disclosure.
Figure 7:
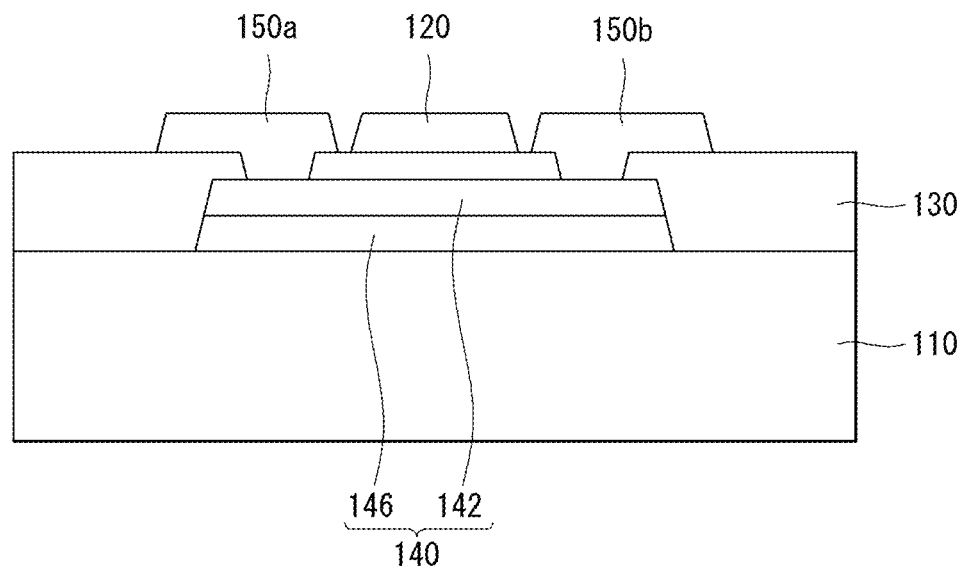
Figure 8:
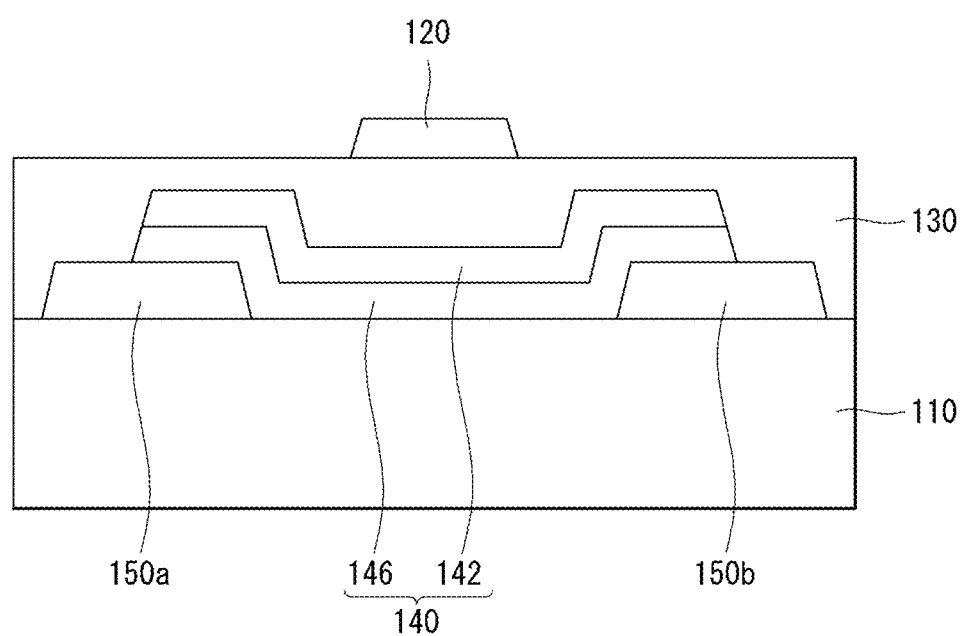

FIG. 3 shows a cross-sectional view of a thin-film transistor array substrate according to an exemplary embodiment of the present disclosure; FIGS. 4 and 5 show cross-sectional views illustrating an active layer according to exemplary embodiments of the present disclosure; and FIGS. 6 to 8 show cross-sectional views illustrating various structures of a thin-film transistor array substrate according to exemplary embodiments of the present disclosure.

Thin-film Transistor Array Substrate

The thin-film transistor array substrate disclosed in the present disclosure is explained using a bottom-gate type thin-film transistor in which a gate electrode is disposed under an active layer as an exemplary embodiment.

Referring to FIG. 3, a gate electrode 120 is disposed on a substrate 110.

The substrate 110 is made of a transparent or opaque glass, plastic, or metal. The gate electrode 120 may be formed of a single layer or multiple layer of any one selected from the group consisting of copper (Cu), molybdenum (Mo), aluminum (Al), chromium (Cr), gold (Au), titanium (Ti), nickel (Ni), neodymium (Nd), tantalum (Ta), and tungsten (W), or an alloy thereof. The gate insulating film 130 is disposed on the gate electrode 120 for insulating the gate electrode 120. The gate insulating film 130 is formed of a silicon oxide film ($SiO_x$), a silicon nitride film ($SiN_x$), or a multilayer thereof.

The active layer 140 is disposed on the gate insulating film 130. The active layer 140 is formed of the carbon allotrope-semiconductor composition of the present disclosure. The active layer 140 of the present disclosure includes a first active layer 142 and a second active layer 146. The first active layer 142 is disposed adjacent to the gate electrode 120 and the second active layer 146 is disposed to be apart from the gate electrode 120 with the first active layer 142 therebetween. The first active layer 142 forms a lower part of the active layer 140 and the second active layer 146 is disposed on top of the first active layer 142 and forms an upper part of the active layer 140.

The first active layer 142 is a layer in which an active layer channel is formed and includes a semiconductor material and a plurality of carbon allotropes. In the first active layer 142, the semiconductor material controls a threshold voltage by allowing the first active layer 142 to act as a semiconductor. In the first active layer 142, a plurality of carbon allotropes accelerate electron mobility by allowing carriers to move rapidly through the carbon allotropes. Most of the first active layer 142 is made of a semiconductor material and the carbon allotropes are dispersed in semiconductor materials. In particular, since the carbon allotropes are dispersed in the first active layer 142, the electrons and holes initially move according to the charge mobility of the semiconductor materials in the semiconductor material and then move very rapidly in the carbon allotropes disposed to be close to the conductor. Electrons and holes can move along with semiconductors and carbon allotropes, thereby significantly improving charge mobility.

The second active layer 146 is a layer having a role of supplying carriers to the channel of the first active layer 142 and may be made of only a semiconductor material or by including a plurality of carbon allotropes dispersed in the semiconductor material. In the second active layer 146, the semiconductor material allows the second active layer 146 to act as a semiconductor. When the second active layer 146 contains a plurality of carbon allotropes, the plurality of carbon allotropes allow carriers to move rapidly through the carbon allotropes thereby accelerating electron mobility.

Referring to FIG. 4, the content ratio accounted by the carbon allotropes in the first active layer 142 may be higher than that accounted by the carbon allotropes in the second active layer 146. For example, when the semiconductor solid content of each of the first active layer 142 and the second active layer 146 is 100 g, the carbon allotropes of the first active layer 142 may be formed to have a content of 0.1 g and the carbon allotropes of the second active layer 146 may be formed to have a content of 0.01 g. The relatively high content ratio of carbon allotropes means that the characteristic of the carbon allotropes acts as a conductor. Accordingly, by increasing the content ratio of carbon allotropes to the first active layer 142 in which a channel is formed, the mobility of carriers moving through the channel can be accelerated. Therefore, there is an advantage in that the electron mobility of the active layer 140 can be improved. A substantial channel is not formed in the second active layer 146 even when the content ratio of carbon allotropes of the second active layer 146 is formed to be relatively smaller than that of the carbon allotropes of the first active layer 142, and thus the second active layer 146 can contribute to the supply of carriers to the first active layer 142 without significant influence on electron mobility.

The content of the carbon allotropes in the first active layer 142 is 0.05 wt % to 1 wt % based on 100 wt % of the content of the semiconductor material. In particular, when the content of carbon allotropes is greater than or equal to 0.05% based on 100 wt % of the semiconductor material, the electron mobility of the active layer may be improved, whereas when the content of the content of carbon allotropes is less than or equal to 1 wt % based on 100 wt % of the content of the semiconductor material, the threshold voltage of the transistor can be prevented from moving in the negative (−) direction.

The carbon allotropes may not be contained in the second active layer 146 but when the carbon allotropes are contained in the second active layer 146, the content of the carbon allotropes in the second active layer 146 is 0.001 wt % to 0.01 wt % based on 100 wt % of the semiconductor material. In particular, when the content of carbon allotropes is greater than or equal to 0.001% based on 100 wt % of the content of the semiconductor material, the electron mobility of the active layer may be improved, whereas when the content of carbon allotropes is less than or equal to 0.01 wt % based on 100 wt % of the content of the semiconductor material, the threshold voltage of the transistor can be prevented from moving in the negative (−) direction. For reference, 100 wt % of the semiconductor material means 100 wt % of semiconductor material solids, and refers to the wt % of the carbon allotropes solids relative to 100 wt % of the semiconductor material solids.

The first active layer 142 may have a thickness of 1 nm to 10 nm. When a thickness of the first active layer 142 is greater than or equal to 1 nm, the channel can be prevented from being formed to a smaller thickness, whereas when a thickness of the first active layer 142 is less than or equal to 10 nm, the active layer can be prevented from becoming thick. The second active layer 146 may have a thickness of 1 nm to 10 nm. When a thickness of the second active layer 146 is greater than or equal to 1 nm, it becomes easy to supply carriers to the channel, whereas when a thickness of the second active layer 146 is less than or equal to 10 nm, the active layer can be prevented from becoming thick.

Meanwhile, the content ratio of the carbon allotropes contained in the first active layer 142 or second active layer 146 may form a slope.

Referring to FIGS. 3 and 5, when the carbon allotropes are contained in the first active layer 142 and the second active layer 146, the content ratios of the first active layer 142 and the second active layer 146 may be reduced as the carbon allotropes of the first active layer 142 and the second active layer 146 become farther from the gate electrode 120. Since the first active layer 142 is disposed adjacent to the gate electrode 120, a channel is formed in the first active layer 142 in a region adjacent to the gate electrode 120. Therefore, the electron mobility of the active layer can be improved by making the content ratio of the carbon allotropes to be highest in the channel region of the first active layer 142. Additionally, the content ratio of the carbon allotropes gradually decreases from the first active layer 142 to the second active layer 146, which is a direction that gradually moves away from the gate electrode 120. The electron mobility enhancing characteristics of carbon allotropes can exhibit the greatest effect in the channel region and serve to supply carriers in regions other than the channel region. Accordingly, the content ratio of the carbon allotropes is highest in the channel region of the active layer 140 and gradually decreases as becoming farther from the channel region.

The above-described active layer 140 is formed by coating the above-described carbon allotrope-semiconductor composition twice on the substrate 110, on which the gate insulating film 130 is formed, so as to include the first active layer 142 and the second active layer 146. Exemplary methods for coating the carbon allotrope-semiconductor composition may include spin coating, slit coating, screen printing, ink-jet printing, etc., and any method may be used as long as it involves coating a solution. The solvent is removed by heating the carbon allotrope-semiconductor thin-film at 250° C. for 2 hours. Then, the active layer 140 of the present disclosure may be prepared by patterning the carbon allotrope-semiconductor thin-film via photolithography method.

A source electrode 150a, which comes in contact with one side of the active layer 140, and a drain electrode 150b, which comes in contact with contact with the other side of the active layer 140, are disposed on the active layer 140. The source electrode 150a and the drain electrode 150b may be formed of a single layer or multiple layer. When the source electrode 150a and drain electrode 150b are formed of a single layer, they may be made of any one selected from the group consisting of molybdenum (Mo), aluminum (Al), chromium (Cr), gold (Au), titanium (Ti), nickel (Ni), neodymium (Nd), and copper (Cu), or an alloy thereof. Additionally, when the source electrode 150a and drain electrode 150b are formed of multiple layers, they may be formed of a double layer of molybdenum/aluminum-neodymium, molybdenum/aluminum, or titanium/aluminum, or a triple layer of molybdenum/aluminum-neodymium/molybdenum, molybdenum/aluminum/molybdenum, or titanium/aluminum/titanium.

In the above-described active layer 140 of the present disclosure, when a voltage is applied to the source electrode 150a and drain electrode 150b by dispersing the carbon allotropes in a semiconductor material, electrons and holes move to the channel of the active layer 140. In particular, since the carbon allotropes are dispersed in the channel of the active layer 140, electrons and holes move according to the charge mobility of a semiconductor material in the semiconductor material, and move very rapidly in the carbon allotropes disposed close to the conductor. As electrons and holes move along the semiconductor and carbon allotropes, the charge mobility can be improved significantly. In particular, while semiconductor materials have a characteristic that electron mobility decreases due to scattering, which is a phenomenon that occurs during electron movement, scattering rarely occurs within carbon allotropes thus the risk of a decrease in electron mobility can be eliminated.

Additionally, since the active layer 140 of the present disclosure contains a small amount of carbon allotropes, there is almost no path formed, through which carriers move, by a contact (or a chemical bonding) between carbon allotropes. Accordingly, the increase in an OFF current due to deterioration of the semiconductor characteristics of the active layer 140 can be prevented.

Meanwhile, the thin-film transistor array substrate of the present disclosure may have various structures with regard to the thin-film transistors.

Referring to FIG. 6, the thin-film transistor array substrate of the present disclosure is formed to have a bottom-gate type structure in which the source electrode 150a and the drain electrode 150b may be disposed between the active layer 140 and the gate insulating film 130. More specifically, the gate electrode 120 is disposed on the substrate 110 and the gate insulating film 130 is disposed on the gate electrode 120. The source electrode 150a and drain electrode 150b spaced apart from each other may be disposed on the gate insulating film 130, and the active layer 140 may be disposed to come in contact with the source electrode 150a and drain electrode 150b on the gate insulating film 130. In particular, the active layer 140 may be arranged such that the first active layer 142 is disposed adjacent to the gate electrode 120 while the second active layer 146 is spaced apart from the gate electrode 120. Accordingly, a channel is allowed to form in the first active layer 142 having a high content ratio of carbon allotropes.

Additionally, referring to FIG. 7, the thin-film transistor array substrate of the present disclosure, being comprised of a top-gate structure, is characterized in that the gate electrode 120, the source electrode 150a, and the drain electrode 150b may be disposed on the gate insulating film 130. More specifically, the active layer 140 is disposed on the substrate 110 and the gate insulating film 130 is disposed on the active layer 140. The source electrode 150a and the drain electrode 150b spaced apart from each other may be disposed on the gate insulating film 130 and to be in contact with the active layer 140, and the gate electrode 120 may be interposed between the source electrode 150a and the drain electrode 150b. In particular, the active layer 140 may be arranged such that the first active layer 142 is disposed adjacent to the gate electrode 120 while the second active layer 146 is disposed to be spaced apart from the gate electrode 120. Accordingly, a channel is arranged to be formed on the first active layer 142 which has a high content ratio of carbon allotropes.

Additionally, referring to FIG. 8, the thin-film transistor array substrate of the present disclosure, being comprised of a top-gate structure, is characterized in that the source electrode 150a and the drain electrode 150b may be disposed under the active layer 140. More specifically, the source electrode 150a and the drain electrode 150b, which are spaced apart from each other, may be disposed on the substrate 110 and the active layer 140 may be disposed to be in contact with the source electrode 150a and the drain electrode 150b on the source electrode 150a and the drain electrode 150b respectively. The gate insulating film 130 may be disposed on the active layer 140 and the gate electrode 120 may be disposed on the gate insulating film 130. In particular, the active layer 140 may be arranged such that the first active layer 142 is disposed adjacent to the gate electrode 120 and the second active layer 146 is disposed to be spaced apart from the gate electrode 120. Accordingly, a channel is arranged to be formed on the first active layer 142 which has a high content ratio of carbon allotropes.

Figure 9:
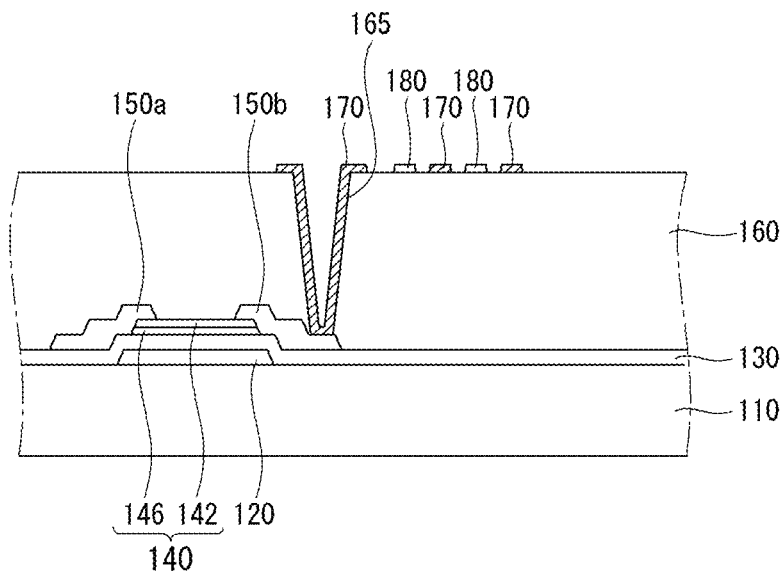
FIGS. 9 and 10 show cross-sectional views illustrating a display device according to exemplary embodiments of the present disclosure.
Figure 10:
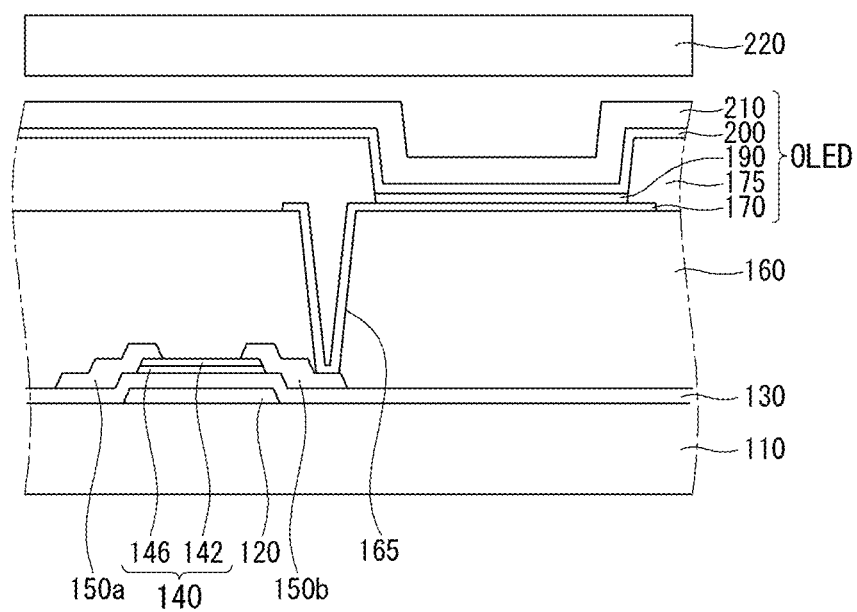

Hereinafter, a display device including the thin-film transistor array substrate of the present disclosure will be described with reference to FIGS. 9 and 10. A display device including a thin-film transistor array substrate according to a first embodiment will be disclosed below and any duplicate description will be omitted. FIG. 9 shows a cross-sectional view illustrating a liquid crystal display device according to an exemplary embodiment of the present disclosure and FIG. 10 shows a cross-sectional view illustrating an organic light emitting display device according to an exemplary embodiment of the present disclosure.

Display Device

Referring to FIG. 9, an organic insulating film 160 is disposed on the source electrode 150a and the drain electrode 150b. The organic insulating film 160 is for planarizing irregularities beneath it and may be made of an organic material such as photoacryl, polyimide, benzocyclobutene resin, acrylate resin, etc. The organic insulating film 160 includes a via hole 165 exposing the drain electrode 150b. Although not shown, a passivation film made of silicon oxide ($SiO_x$), silicon nitride (SiNx), or a multiple layer thereof may be disposed on the source electrode 150a and the drain electrode 150b.

A pixel electrode 170 and a common electrode 180 are disposed on the organic insulating film 160. The pixel electrode 170 is connected to the drain electrode 150b through the via hole 165 formed on the organic insulating film 160. The pixel electrode 160 is formed of a transparent and conductive material such as indium tin oxide (ITO) and indium zinc oxide (IZO). The common electrode 180 is made of the same material as the pixel electrode 170. The pixel electrode 170 and the common electrode 180 are arranged alternately and form a horizontal electric field between the pixel electrode 170 and the common electrode 180, thereby driving a liquid crystal layer disposed on the pixel electrode 170 and the common electrode 180.

Exemplary embodiments of the present disclosure have been described with regard to an in-plane switching (IPS) liquid crystal display in which a pixel electrode and a common electrode are disposed on the same plane. However, the present disclosure is not limited to thereto, but instead the common electrode may be disposed under the pixel electrode or the common electrode may be disposed on a color filter array substrate opposing the thin-film transistor array substrate.

Meanwhile, referring to FIG. 10, the display device of the present disclosure may be an organic light emitting display including an organic light emitting diode. More specifically, the organic insulating film 160 is positioned on the source electrode 150a and the drain electrode 150b. The organic insulating film 160 includes the via hole 165 exposing the drain electrode 150b.

The pixel electrode 170 is disposed on the organic insulating film 160. The pixel electrode 170 is connected to the drain electrode 150b through the via hole 165 on the organic insulating film 160. A bank layer 175 is disposed on the pixel electrode 170. The bank layer 175 may be a pixel definition layer that defines a pixel by exposing a part of the pixel electrode 170. An organic layer 190 is disposed on the bank layer 175 and the exposed pixel electrode 170. The organic layer 190 includes an emitting layer that emits light by the binding between electrons and holes, and may include a hole injection layer, a hole transport layer, an electron transport layer, or an electron injection layer. An opposing electrode 200 is disposed on a substrate 110 on which the organic film 190 is formed. The opposing electrode 200 is a cathode and may be made of magnesium (Mg), calcium (Ca), aluminum (Al), silver (Ag), or an alloy thereof having a low work function. Accordingly, an organic light emitting diode (OLED) including the pixel electrode 170, the organic layer 190, and the opposing electrode 200 is formed.

An encapsulation layer 210 is disposed on the substrate 110 on which the organic light emitting diode (OLED) is formed. The encapsulation layer 210 encapsulates the substrate 110, which includes the underlying organic light emitting diode (OLED), and may comprise of an inorganic film, an organic film, or a multi-layer structure thereof. A cover window 220 is disposed on the encapsulation layer 210 and forms an organic light emitting display device.

Hereinafter, experimental examples with respect to an active layer including a carbon allotrope and a semiconductor material according to embodiments of the present disclosure will be described. The following experimental examples are only exemplary embodiments of the present disclosure and the present disclosure is not limited thereto.

EXPERIMENTAL EXAMPLE 1

Analysis of Active Layer Composition

Figure 11:
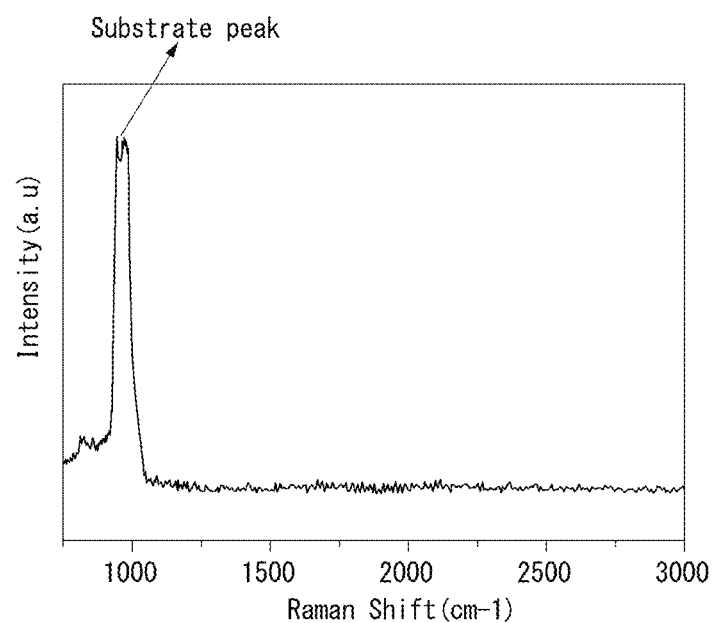
FIG. 11 shows a graph illustrating a result of Raman spectrum analysis of an active layer made of only a semiconductor material.

The compositions of an active layer consisting of only a semiconductor material and an active layer, in which a semiconductor material and a carbon allotrope are mixed, were subjected to Raman spectral analysis. In particular, graphene was used as the carbon allotrope and 0.1 wt % of graphene was mixed relative to 100 wt % of semiconductor material solids. FIG. 11 shows a graph illustrating a result of Raman spectrum analysis of an active layer made of only a semiconductor material and FIG. 12 shows a graph illustrating a result of Raman spectrum analysis of an active layer in which a semiconductor material and a carbon allotrope are mixed.

Referring to FIG. 11, the Raman spectrum analysis result of an active layer consisting of only a semiconductor material showed only the peak of a substrate in which an active layer was formed.

Figure 12:
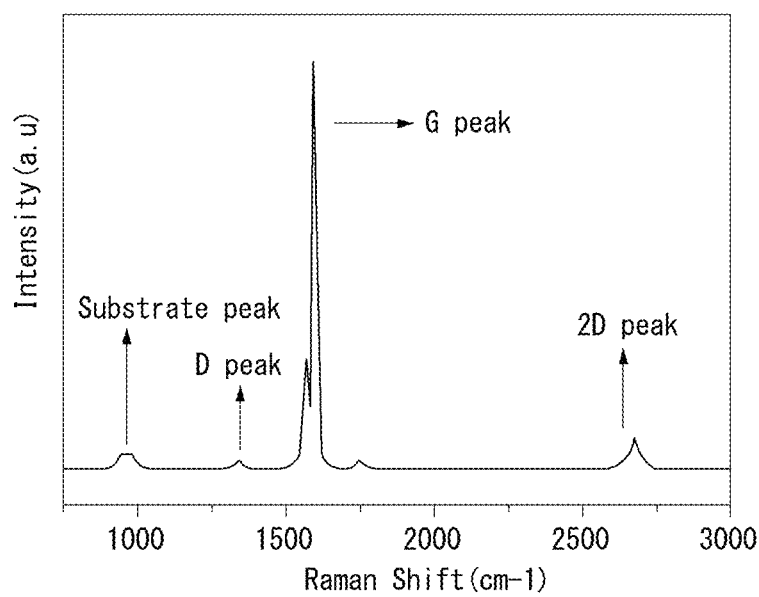
FIG. 12 shows a graph illustrating a result of Raman spectrum analysis of an active layer in which a semiconductor material and a carbon allotrope are mixed.

Meanwhile, referring to FIG. 12, the Raman spectrum analysis result of an active layer, in which a semiconductor material and graphene were mixed, showed G, D, 2D peaks in the presence of a carbon allotrope in addition to a substrate peak. Generally, when graphene or a carbon nanotube is present in a thin film, G peak, D peak, and 2D peak appear in Raman spectrum analysis. In particular, the position of the G peak is 1580 cm$^{-1}$, the position of the D peak is 1340 cm$^{-1}$, and the position of the 2D peak is 2700 cm$^{-1}$. G peak, which is called a G peak after 'g' of graphite, is a peak commonly found in graphite materials, and a D peak, being a peak due to a defect in the crystal, is a peak related to a defect of graphene or carbon nanotube. Since the 2D peak appears when the non-elastic scattering by the phonon having an energy of 1350 cm$^{-1}$ occurs twice consecutively, the 2D peak appears at around 2700 cm$^{-1}$. Generally, in a single-layer graphene, the 2D peak is higher than the G peak while, in the multilayer graphene, the 2D peak is lower than the G peak. In D peaks, as the number of defects present in graphene or carbon nanotubes increases, the peak value increases. Accordingly, the result of Raman spectrum analysis based on the appearance of G, D, and 2D peaks confirmed the presence of carbon allotropes.

EXPERIMENTAL EXAMPLE 2

Evaluation of Thin-film Transistors

COMPARATIVE EXAMPLE 1

As shown in FIG. 3, an active layer was formed by coating pure active IGZO and a bottom-gate type thin-film transistor was prepared.

COMPARATIVE EXAMPLE 2

A thin film transistor was manufactured under the same process conditions as in Comparative Example 1 described above, except that the active layer was formed by mixing an IGZO solution with 0.1 wt % of graphene powder relative to 100 wt % of IGZO solids.

EXAMPLE

A thin film transistor was manufactured under the same process conditions as in comparative example 1 described above, except that the first active layer was formed by mixing an IGZO solution with 0.1 wt % of graphene powder relative to 100 wt % of IGZO solids and the second active layer was formed by coating pure IGZO on the first active layer.

Figure 13:
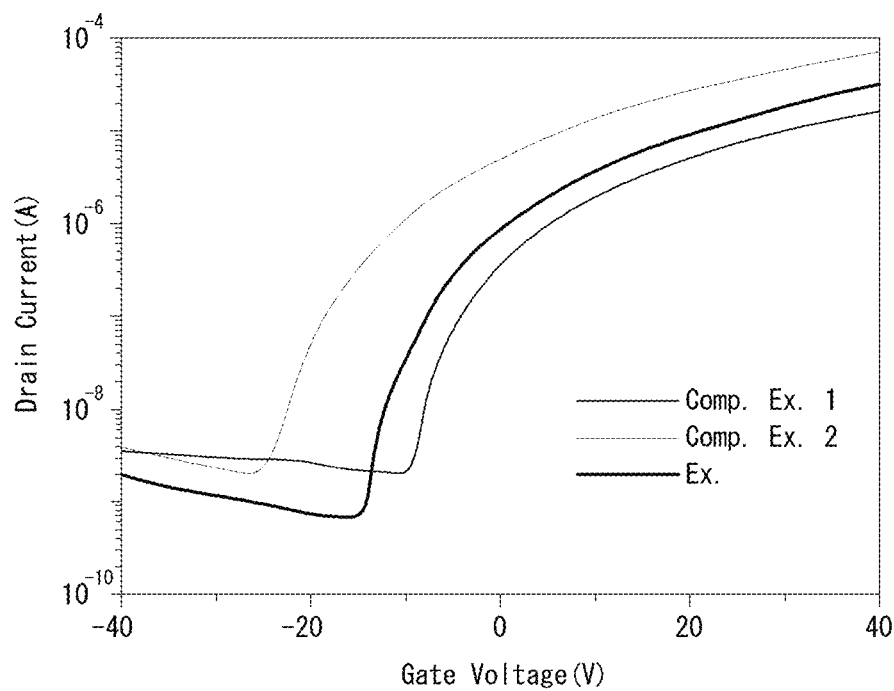
FIG. 13 shows a graph illustrating current-voltage curves of thin-film transistors manufactured according to Comparative Examples 1 and 2 and Example.
Figure 14:
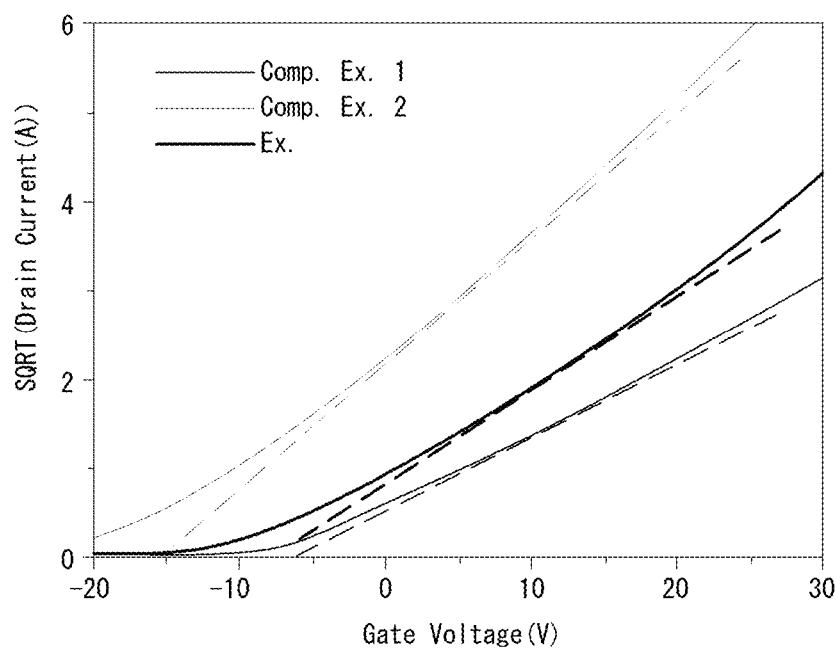
FIG. 14 shows a graph illustrating the SQRT-voltage representing a square root value of the drain current of FIG. 13.

The current-voltage curves of thin-film transistors manufactured according to comparative examples 1 and 2 and example were measured and shown in FIG. 13 and the SQRT-voltage representing the square root value of the drain current of FIG. 13 was measured and shown in FIG. 14. The threshold voltage and electron mobility are shown in Table 1 below.

TABLE 1

|  | Comparative Example 1 | Comparative Example 2 | Example |
|---|---|---|---|
| Threshold Voltage (Vth, V) | −6 ± 0.5 | −14 ± 2 | −7 ± 0.5 |
| Electron Mobility (cm$^2$/Vs) | 3.6 ± 0.7 | 14.5 ± 0.9 | 7.8 ± 0.4 |

Referring to FIG. 13, FIG. 14 and Table 1, in comparative example 1 where an active layer made of only IGZO was provided, the threshold voltage was shown to be −6±0.5 V and the electron mobility was shown to be 3.6±0.7 cm$^2$/Vs. In comparative example 2 where a single-layered active layer mixed with IGZO and graphene was provided, the threshold voltage was shown to be −14±2 V and the electron mobility was shown to be 14.5±0.9 cm$^2$/Vs. In example where a first active layer mixed with IGZO and graphene and a second active layer consisting of only IGZO were stacked, the threshold voltage was shown to be −7±0.5 V and the electron mobility was shown to be 7.8±0.4 cm$^2$/Vs.

In summary, in comparative example 1 where the active layer made of only IGZO was provided, the threshold voltage characteristic was good but the electron mobility was low. Additionally, in comparative example 2 where a single-layered active layer mixed with IGZO and graphene was provided, the electron mobility was high but the threshold voltage was moved in the negative (−) direction and thus the characteristic was low. Meanwhile, in example where a first active layer mixed with IGZO and graphene and a second active layer consisting of only IGZO were stacked, the threshold voltage was higher compared to that of comparative example 1 and the electron mobility was also higher compared to that of comparative example 2.

Accordingly, by forming an active layer having a double-layered structure including a semiconductor material and a carbon allotrope such that a plurality of carbon allotropes are included on the first active layer where a channel is formed, the present disclosure has an advantage in that it can improve the electron mobility of a thin-film transistor. Additionally, by forming a second active layer including a smaller amount of carbon allotropes compared to that of the first active layer, the present disclosure has an advantage in that it can improve the threshold voltage characteristic.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A thin-film transistor array substrate, comprising:
a substrate;
a gate electrode on the substrate;
an active layer comprising a first active layer, which opposes the gate electrode and is adjacent to the gate electrode thereby comprising a semiconductor material and a plurality of carbon allotropes, and a second active layer, which is in contact with the first active layer and comprises a semiconductor material, the second active layer positioned farther from the gate electrode than the first active layer;
a gate insulating film between the gate electrode and the active layer; and
a source electrode and a drain electrode respectively in contact with the active layer,
wherein the second active layer further comprises a plurality of carbon allotropes, and a content ratio being accounted by the carbon allotropes in the first active layer is higher than a content ratio being accounted by the carbon allotropes in the second active layer.

2. The thin-film transistor array substrate of claim 1, wherein the carbon allotropes are dispersed within the semiconductor material.

3. The thin-film transistor array substrate of claim 1, wherein the content ratio of the carbon allotropes in the first active layer decreases as the carbon allotropes go farther from the gate electrode.

4. The thin-film transistor array substrate of claim 1, wherein the content ratio of the carbon allotropes in the second active layer decreases as the carbon allotropes go farther from the gate electrode.

5. The thin-film transistor array substrate of claim 1, wherein the carbon allotropes have a one-dimensional structure or two-dimensional structure.

6. The thin-film transistor array substrate of claim 1, wherein the carbon allotrope is one selected from a group consisting of reduced graphene oxide (rGO), non-oxidized graphene, graphene nanoribbon, carbon nanotube (CNT), or a mixture thereof.

7. The thin-film transistor array substrate of claim 1, wherein the semiconductor material is one selected from a group consisting of a ceramic semiconductor, an organic semiconductor, a transition metal chalcogenide, and an oxide semiconductor, or a mixture thereof.

8. The thin-film transistor array substrate of claim 1, wherein a content of the carbon allotropes in the first active layer is 0.05 wt % to 1 wt % based on 100 wt % of a content of the semiconductor material.

9. The thin-film transistor array substrate of claim 1, wherein a content of the carbon allotropes in the second active layer is 0.001 wt % to 0.01 wt % based on 100 wt % of a content of the semiconductor material.

10. The thin-film transistor array substrate of claim 1, wherein a thickness of the first active layer and the second active layer is in a range of 1 nm to 10 nm, respectively.

11. The thin-film transistor array substrate of claim 1, wherein the plurality of carbon allotropes in the first layer is dispersed throughout the first layer in its entirety, and wherein the plurality of carbon allotropes in the second layer is dispersed throughout the second layer in its entirety.

12. A display device, comprising:
a substrate;
a gate electrode on the substrate;
an active layer comprising a first active layer, which opposes the gate electrode and is adjacent to the gate electrode thereby comprising a semiconductor material and a plurality of carbon allotropes, and a second active layer, which is in contact with the first active layer and comprises a semiconductor material, wherein the second active layer is positioned farther from the gate electrode than the first active layer;
a gate insulating film between the gate electrode and the active layer;
a source electrode and a drain electrode respectively in contact with the active layer;
an organic insulating film on the source electrode and the drain electrode; and
a pixel electrode on the organic insulating film,
wherein the second active layer further comprises a plurality of carbon allotropes, and a content ratio being accounted by the carbon allotropes in the first active layer is higher than a content ratio being accounted by the carbon allotropes in the second active layer.

13. The display device of claim 12, wherein the carbon allotropes are dispersed within the semiconductor material.

14. The display device of claim 12, wherein the content ratio of the carbon allotropes in the first active layer decreases as the carbon allotropes go farther from the gate electrode.

15. The display device of claim 12, wherein the content ratio of the carbon allotropes in the second active layer decreases as the carbon allotropes go farther from the gate electrode.

16. The display device of claim 12, wherein the carbon allotropes have a one-dimensional structure or two-dimensional structure.

17. The display device of claim 12, wherein the carbon allotrope is one selected from a group consisting of reduced graphene oxide (rGO), non-oxidized graphene, graphene nanoribbon, carbon nanotube (CNT), or a mixture thereof.

18. The display device of claim 12, wherein the semiconductor material is one selected from a group consisting of a ceramic semiconductor, an organic semiconductor, a transition metal chalcogenide, and an oxide semiconductor, or a mixture thereof.

19. The display device of claim 12, wherein a content of the carbon allotropes in the first active layer is 0.05 wt % to 1 wt % based on 100 wt % of a content of the semiconductor material.

20. The display device of claim 12, wherein a content of the carbon allotropes in the second active layer is 0.001 wt % to 0.01 wt % based on 100 wt % of a content of the semiconductor material.

21. The display device of claim 12, wherein a thickness of the first active layer and the second active layer is in a range of 1 nm to 10 nm, respectively.

22. The display device of claim 12, further comprising:
an organic light emitting diode electrically connected to the pixel electrode;
an encapsulation layer on the organic light emitting diode; and
a cover window on the encapsulation layer.

23. The display device of claim 12, further comprising:
a common electrode, which is disposed to be spaced apart from the pixel electrode on the same plane or a lower part thereof; and
a liquid crystal layer disposed on the common electrode.

* * * * *